US012754227B2

(12) United States Patent
Lee et al.

(10) Patent No.: US 12,754,227 B2
(45) Date of Patent: Oct. 6, 2026

(54) TEST TRAY FOR SEMICONDUCTOR DEVICES AND TEST APPARATUS USING THE SAME

(71) Applicant: ATECO INC., Gunpo-si (KR)

(72) Inventors: Taek Seon Lee, Hwaseong-si (KR); Ho Nam Kim, Seongnam-si (KR); Sung Chul Moon, Gunpo-si (KR); Han Su Bae, Siheung-si (KR); Ju Hyun Kim, Suwon-si (KR)

(73) Assignee: ATECO INC., Gunpo-si (KR)

( * ) Notice: Subject to any disclaimer, the term of this patent is extended or adjusted under 35 U.S.C. 154(b) by 97 days.

(21) Appl. No.: 18/746,515

(22) Filed: Jun. 18, 2024

(65) Prior Publication Data

US 2025/0164543 A1 May 22, 2025

(30) Foreign Application Priority Data

Nov. 16, 2023 (KR) ........................ 10-2023-0159239

(51) Int. Cl.
*G01R 31/26* (2020.01)

(52) U.S. Cl.
CPC ................................ *G01R 31/2601* (2013.01)

(58) Field of Classification Search
CPC ............ G01R 31/2601; G01R 31/2893; G01R 31/2867; G01R 31/2887; G01R 31/2889; G01R 31/2863
See application file for complete search history.

(56) References Cited

U.S. PATENT DOCUMENTS

| | | | | |
|---|---|---|---|---|
| 6,469,496 B1 | 10/2002 | Khouw et al. | | |
| 2005/0012498 A1* | 1/2005 | Lee | G01R 31/2893 | 324/759.03 |
| 2022/0026486 A1* | 1/2022 | Horino | G01R 31/2887 | |
| 2023/0105734 A1* | 4/2023 | Imaizumi | G01R 1/0483 | 324/756.02 |

FOREIGN PATENT DOCUMENTS

| | | |
|---|---|---|
| JP | 2015-62036 A | 4/2015 |
| KR | 10-2010-0110430 A | 10/2010 |
| KR | 10-2018-0005985 A | 1/2018 |
| KR | 10-2249307 B1 | 5/2021 |
| KR | 10-2023-0049019 A | 4/2023 |

* cited by examiner

*Primary Examiner* — Alvaro E Fortich

(57) ABSTRACT

Disclosed is a test tray to which a semiconductor device is mounted according to an embodiment of the disclosure, the test tray including: a plurality of inserts to which the semiconductor devices are mounted; and a frame which supports the inserts in arrangement respectively corresponding to sockets of a test apparatus and has a length in a first axis and a width in a second axis.

11 Claims, 13 Drawing Sheets

TEST TRAY FOR SEMICONDUCTOR DEVICES AND TEST APPARATUS USING THE SAME

CROSS REFERENCE TO RELATED APPLICATION

This application is based on and claims priority under 35 U.S.C. § 119 to Korean Patent Application No. 10-2023-0159239 filed on Nov. 16, 2023 in the Korean Intellectual Property Office, the disclosure of which is incorporated by reference herein in its entirety.

BACKGROUND OF THE INVENTION

Field of the Invention

The disclosure relates to a test tray for semiconductor devices and a test apparatus in which the test tray is used.

Description of the Related Art

Semiconductor devices that have been finished through a production process are subjected to predetermined tests and graded before being put on the markets. The semiconductor device was tested as mounted to a test apparatus for evaluating the performance of the semiconductor device, thereby achieving the grading.

The tests may vary depending on the types of the semiconductor devices. Further, test results may be classified in various methods.

To test a large number of semiconductor devices rapidly, a handler or the like has been used in testing the semiconductor devices. In this case, a plurality of semiconductor devices has been handled by the handler as loaded on a tray in order to test the large number of semiconductor devices at once.

The tray may be roughly shaped like a rectangular plate, and include a plurality of rows and/or columns. Further, a plurality of devices may be arranged in each row or column of the tray.

Meanwhile, a dual in-line memory module (DIMM) or the like semiconductor device, of which terminals are located on a lateral surface thereof, has been arranged on the tray in a lying-down state. In this case, the lying-down state may refer to a state that the bottom of the tray is positioned in parallel to or on the same plane as the lateral surface of the semiconductor device.

However, the semiconductor devices such as the DIMMs are generally shaped having lengths much longer than the heights of their lateral surfaces. Due to such characteristics, the semiconductor devices such as the DIMMs have wide footprints in their lying-down states, and thus there is a limit to loading a plurality of semiconductor devices while maintaining the size of the tray.

SUMMARY OF THE INVENTION

An aspect of the disclosure is to provide a test tray which can load a large number of semiconductor devices thereon compared to the size of a tray.

Further, another aspect of the disclosure is to provide a test apparatus using the same test tray to perform a mounting test.

The problems of the disclosure are not limited to the aforementioned problems, and other problems not mentioned above may become apparent to those skilled in the art from the following description.

According to an embodiment of the disclosure, a test tray, to which a semiconductor device with terminals located on a lateral surface thereof is mounted, may include: a plurality of inserts to which the semiconductor devices are mounted; and a frame which supports the inserts in arrangement respectively corresponding to sockets of a test apparatus and has a length in a first axis and a width in a second axis.

The insert may include: a mounting block to which the semiconductor device is mounted with the lateral surface having an angle to a plane formed by the first axis and the second axis; and a push unit which moves the semiconductor device in a pushing direction to be spaced apart from the mounting block.

The push unit may include: an advance/retreat (e.g., advance and retreat) member formed to advance and retreat on the mounting block, and moving the semiconductor device in the pushing direction while advancing; and a pressing-direction switching unit movable between a standby position and a pressing position on the mounting block along an axis intersecting the pushing direction, and moving from the standby position to the pressing position by an external force to move the advance and retreat member in the pushing direction.

The pressing-direction switching unit may include: a movable member moving between the standby position and the pressing position; and a slider connected to the movable member, and pushing the advance and retreat member based on a force of pressing the movable member.

The movable member may include a guide slit formed along an axis positioned between an axis where the movable member is moved and an axis where the advance and retreat member advances and retreats.

The slider may include a one end connected to the advance and retreat member and the other end sliding on the guide slit The pressing-direction switching unit may further include an elastic member that provides a restoring force to maintain the movable member located in the standby position upon applying no external force thereto.

The movable member may include a one end exposed to the outside of the mounting block while being in the standby position, and moved to the pressing position as pressed toward the other end by an external force.

The mounting block may include a guide hole or pin extending in parallel with a moving direction of the movable member to interact with elements of an external pressing device while the pressing device presses the movable member.

The mounting block may include an insert alignment hole or pin extending in parallel with the pushing direction to interact with the test apparatus.

The push unit may include a push alignment hole or pin extending in parallel with the pushing direction to further align the push unit with the socket after the test apparatus and the mounting block are aligned by the insert alignment hole or pin.

In a state that the semiconductor device is mounted to the mounting block to locate the lateral surface thereof in front of a front surface of the mounting block, a length of the semiconductor device from the lateral surface to a rear end of the mounting block may be shorter than a height of the lateral surface of the semiconductor device.

According to another embodiment of the disclosure, a test apparatus for a semiconductor device may include: a test board that has a preparation surface on which a test tray with the semiconductor device mounted to an insert is prepared, and performs a test on the semiconductor device mounted to the insert; and a pressing unit that is positioned to face the preparation surface and presses the insert of the test tray prepared on the preparation surface toward the test board.

The test board may include an insert guide block that supports the insert of the test tray prepared on the preparation surface, and a socket that is positioned on the insert guide block, has a connection surface where an axis intersecting a pressing direction of the pressing unit passes, and exchanges signals for a test with the semiconductor device as electrically connected to the terminals of the lateral surface of the semiconductor device being in close contact with the connection surface.

The insert guide block may include an insert alignment hole or pin extended in parallel with a direction of pushing the insert to interact with the insert while the insert is being pushed in a direction intersecting the pressing direction and located adjacent to the socket.

The socket may include a push alignment hole or pin extending in parallel with a direction of pushing the insert so that the semiconductor device can be further aligned with the connection surface after the insert is aligned by the insert alignment hole or pin.

The push alignment hole or pin may have a smaller diameter than the insert alignment hole or pin.

The insert alignment pin may protrude more than the push alignment pin.

The insert guide block may include a preparation alignment hole or pin extending in parallel with a direction in which the test tray approaches the preparation surface so that the insert guide block can interact with the insert while the test tray is being prepared on the preparation surface.

The pressing unit may include a guide hole or pin extending in parallel with the pressing direction to interact with the insert.

Based on the direction perpendicular to the connection surface, the thickness of the insert guide block may be shorter than the height of the lateral surface of the semiconductor device.

Other details of the disclosure are included in the detailed description and the accompanying drawings.

DETAILED DESCRIPTION OF THE INVENTION

Figure 1:
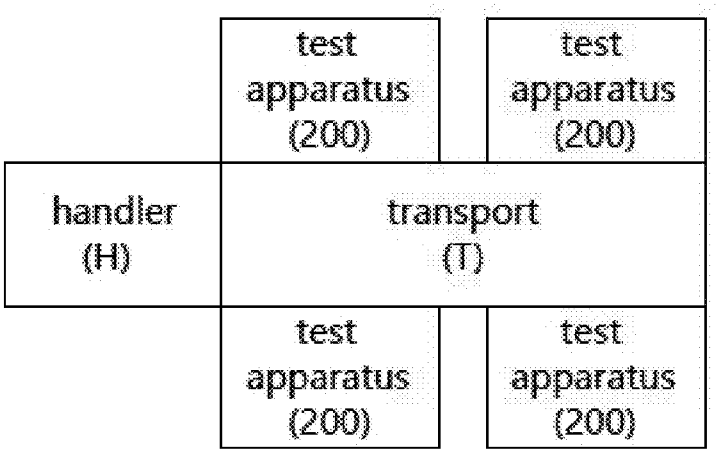
FIG. 1 is a block diagram showing an example of a test system to which a test apparatus according to an embodiment of the disclosure is applicable.

The merits and characteristics of the disclosure and a method for achieving the merits and characteristics will become more apparent from embodiments described below in detail in conjunction with the accompanying drawings. However, the disclosure is not limited to the disclosed embodiments, but may be implemented in various different ways. The embodiments are provided to only complete the disclosure and to allow those skilled in the art to fully understand the category of the disclosure. The disclosure is only defined by the category of the claims.

In addition, embodiments of the disclosure will be described with reference to cross-sectional views, schematic views, or both, as idealized exemplary illustrations. Therefore, the illustrations may be varied in shape depending on manufacturing techniques, tolerance, and the like. Further, elements in the drawings may be relatively enlarged or reduced for convenience of description. Like numerals refer to like elements throughout.

Below, a test tray for semiconductor devices and a test apparatus, in which the test tray is used, according to embodiment of the disclosure will be described with reference to the accompanying drawings.

FIG. 1 is a block diagram showing an example of a test system to which a test apparatus according to an embodiment of the disclosure is applicable. As shown in FIG. 1, a test apparatus 200 according to an embodiment of the disclosure may be used together with a handler H. In the example shown in FIG. 1, a plurality of test apparatuses 200 are included in the system, but the number of test apparatuses 200 may be variously changed according to the needs of a user.

The handler H may refer to a unit that takes charge of transporting and classifying the semiconductor devices. The handler H may transport the semiconductor devices to be tested in the test apparatus 200 from a user tray to the test tray. Further, the handler H may transport the semiconductor devices that has been tested in the test apparatus 200, from the test tray to the user tray for taking the semiconductor devices to the outside.

A transport T may refer to a unit that transports the test tray between the handler H and the test apparatus 200. The transport T may collect the test trays that have completed the tests from the test apparatuses 200 and transport the collected test trays to the handler H. Further, the transport T may transport the test tray that is standing by in the handler H to each test apparatus 200.

The test apparatus 200 may provide a required test environment by controlling temperature or implementing an interface to interact with the semiconductor device as necessary. The semiconductor devices may undergo a required test in the test apparatus 200 while being loaded on the test tray.

The test apparatus 200 may include a device for performing the test, and a device for pressing.

Hereinafter, the device for performing the test will be referred to as a test board. The test board may be electrically connected to the semiconductor devices loaded on the test tray and transmit and receive signals for the test to and from the semiconductor devices.

Further, the device for pressing will be referred to as a pressing unit. The pressing unit may refer to a device for bringing an insert of the test tray prepared on the test board into contact with a socket of the test board.

Figure 2:
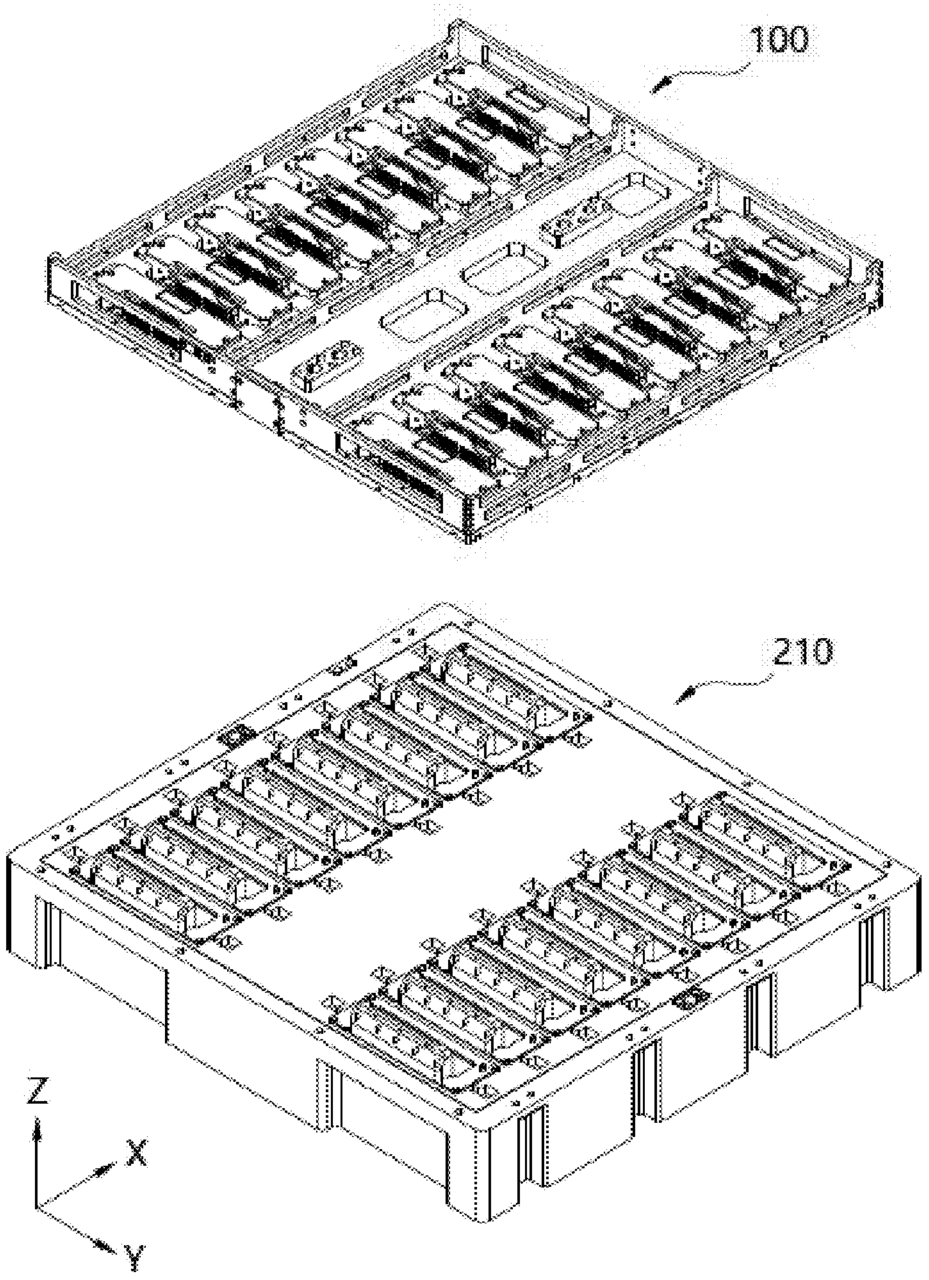
FIG. 2 is a perspective view showing a test board and a test tray according to an embodiment of the disclosure.
Figure 3:
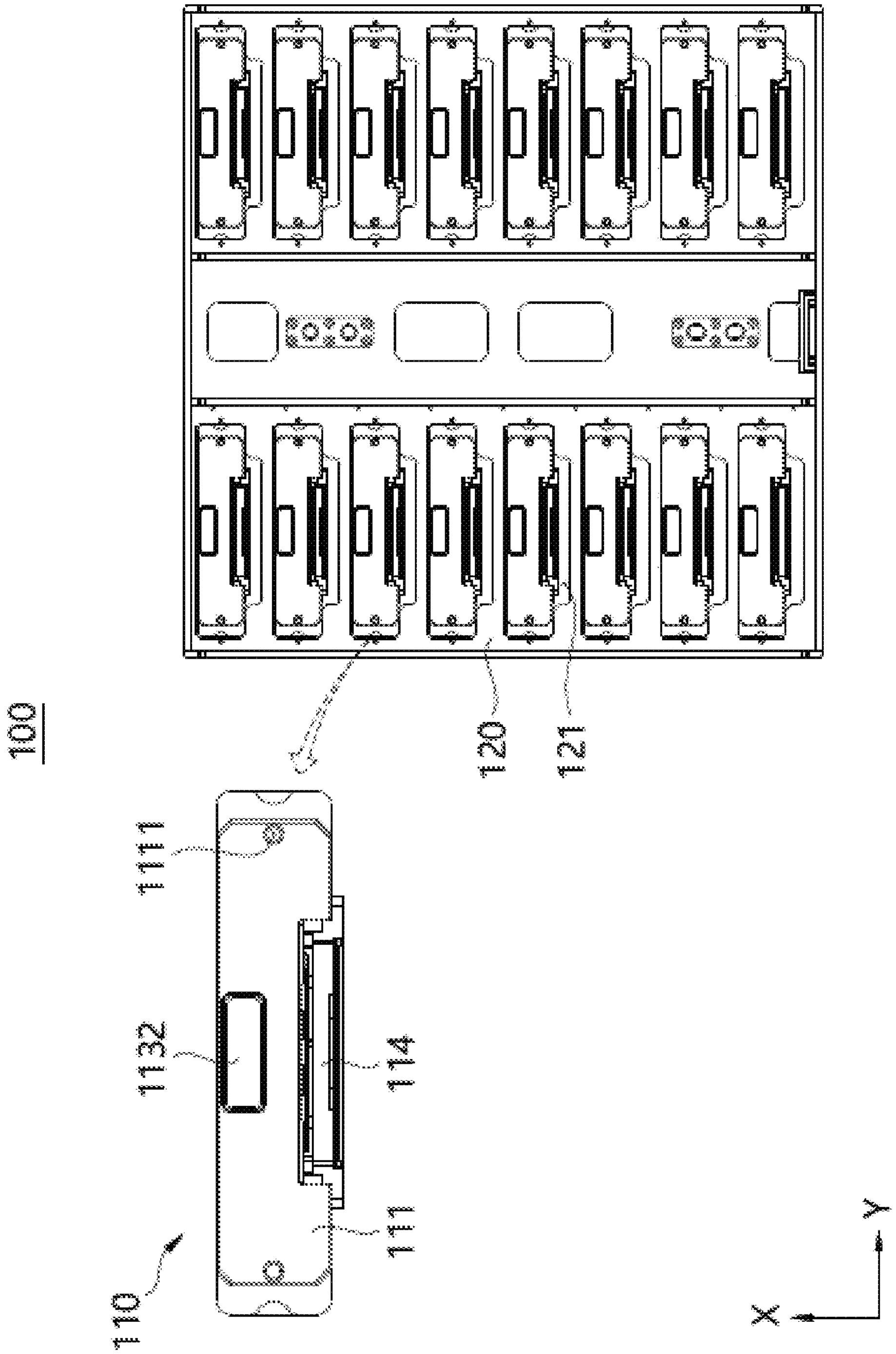
FIG. 3 is a plan view of a test tray according to an embodiment of the disclosure.
Figure 4:
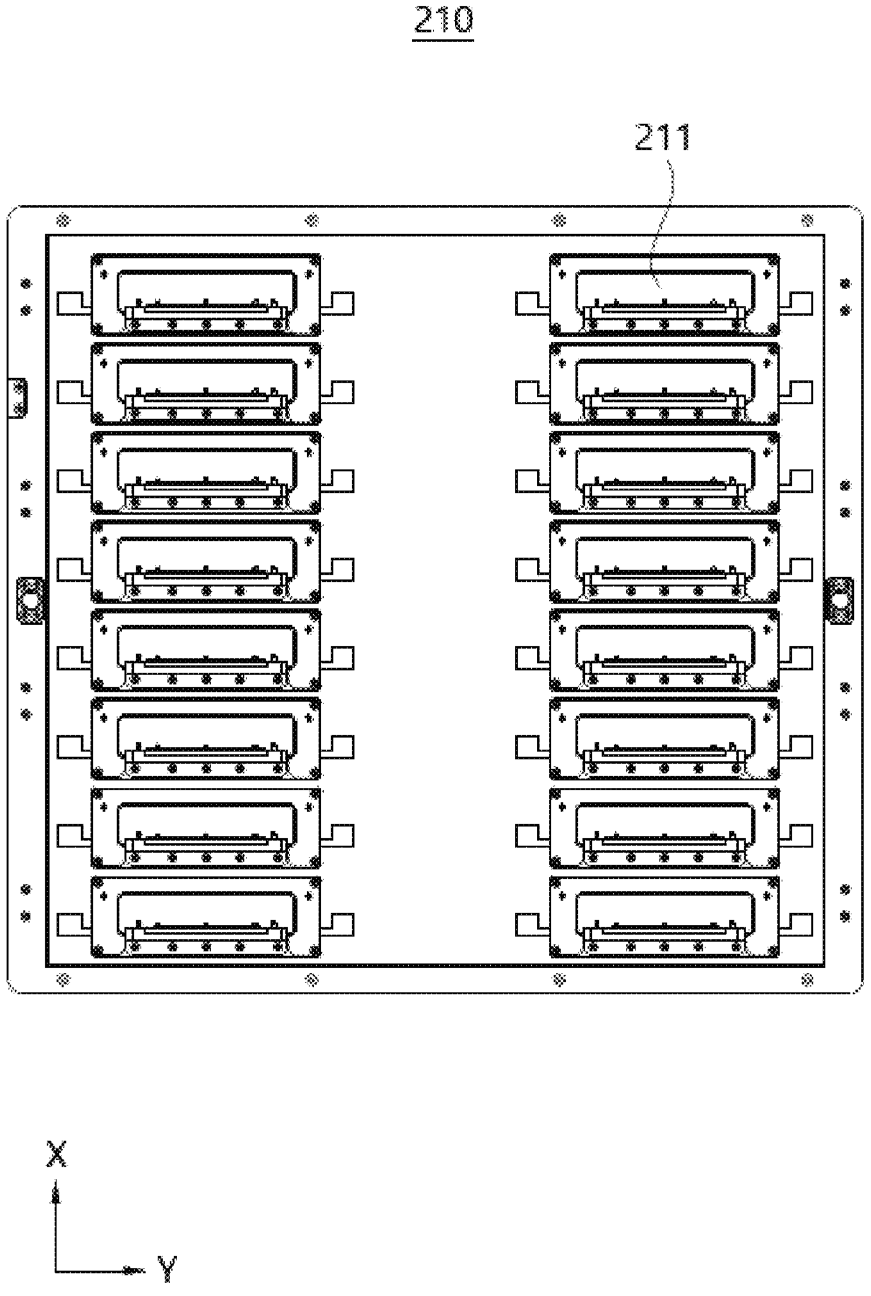
FIG. 4 is a plan view of a test board according to an embodiment of the disclosure.

Below, the test apparatus and the test tray according to an embodiment of the disclosure will be described in detail with reference to FIGS. 2 to 4. FIG. 2 illustrates a test board and a test tray according to an embodiment of the disclosure. In this connection, FIG. 3 is a plan view of the test tray according to an embodiment of the disclosure. Further, FIG. 4 is a plan view of the test board according to an embodiment of the disclosure.

First, referring to FIG. 2, a test tray 100 transported into the test apparatus 200 (see FIG. 1) by the transport T (see FIG. 1) or the like transport device may be aligned coaxially with a test board 210. In this state, when the test tray 100 and the test board 210 approach to along the same axis, the test tray 100 and the test board 210 may come into close contact with each other.

Hereinafter, a state that the central axes of the test tray 100 and the test board 210 are in adjacent contact with each other while being aligned coaxially will be referred to as a state that the test tray 100 is prepared on the test board 210. Further, the top surface (based on FIG. 2) of the test board 210 being in contact with the prepared test tray 100 will be referred to as a preparation surface Meanwhile, FIG. 2 shows an example that the test tray 100 and the test board 210 are aligned based on the Z-axis, but the disclosure is not limited to this example. Alternatively, the test tray 100 may be aligned with the X-axis or Y-axis according to the installation directions of the test board 210.

For convenience of description, the description will be made below on the assumption that the X-axis is a length direction, the Y-axis is a width direction, and the Z-axis is a height direction. However, such a relationship between the directions and the axes may be changed upon actual installation.

Continuing the description with reference to FIGS. 2 and 3, the test tray 100 may be shaped like a rectangular parallelepiped approximately having a large base and a low height. The test tray 100 may include a frame 120 and a plurality of inserts 110.

The frame 120 may form the framework of the test tray 100. The frame 120 may have a length in the X-axis (or a first axis), a width in the Y-axis (or a second axis), and a height in the Z-axis (or a third axis). In some cases, the frame 120 may be referred to as a tray frame to be distinguished from a mounting frame 114 (to be described later).

The frame 120 may be formed with a plurality of insert mounting grooves 121 into which the inserts 110 are mounted, respectively. The insert mounting groove 121 may be formed to penetrate the frame 120, corresponding to the bottom surface of the insert 110. FIG. 3 shows an example that the plurality of insert mounting grooves 121 constitute one row and the plurality of rows of insert mounting grooves 121 are formed in the frame 120. However, the arrangement and number of insert mounting grooves 121 may be variously varied depending on the uses of the disclosure.

In more detail, the shape of the insert mounting groove 121 may additionally include a portion protruding from the bottom surface thereof compared to the shape of the insert 110. The protruding portion may provide clearance for the insert 110 being mounted to and removed from the insert mounting groove 121. Further, the insert mounting groove 121 may be somewhat larger than the insert 110 so that the insert 110 disposed therein can be moved (or shaken) slightly.

The arrangement of the plurality of insert mounting grooves 121 on the frame 120 may correspond to the arrangement of the sockets on the test board 210. The insert 110 mounted to the insert mounting groove 121 may face the corresponding socket on the test board 210 in the state that the test tray 100 is prepared on the test board 210.

The insert 110 may be formed to be mounted to the inside of the insert mounting groove 121, and mount the semiconductor device thereto. Further, the insert 110 may be mounted to the insert mounting groove 121 and movable inside the insert mounting groove 121. Various conventional methods may be implemented to mount the insert 110 to the inside of the insert mounting groove 121 movably.

The detailed configuration of the insert will be described later with reference to FIGS. 5 to 6.

Referring to FIG. 4, the test board 210 may refer to a board fixed to a chamber for the test. The test board 210 may include a computing unit for testing the semiconductor device electrically connected thereto through the socket. In the state that the socket and the semiconductor device are electrically connected, the test board 210 may exchange signals for the test with the semiconductor device through the socket.

On the test board 210, insert guide blocks 211 may be formed at positions corresponding to the insert mounting grooves 121, respectively. The insert guide block 211 may support the corresponding insert 110 of the test tray 100.

In the test board 210, the preparation surface may refer to a surface (i.e., a top surface) on which the plurality of insert guide blocks 211 are located. The test tray 100 may be seated on the test board 210 in the preparation state.

Below, the insert 110 according to an embodiment of the disclosure will be described with reference to FIGS. 5 to 6. FIG. 5 illustrates an insert according to an embodiment of the disclosure. In this connection, FIG. 6 illustrates a state that a semiconductor device is mounted to the insert according to an embodiment of the disclosure.

Figure 5:
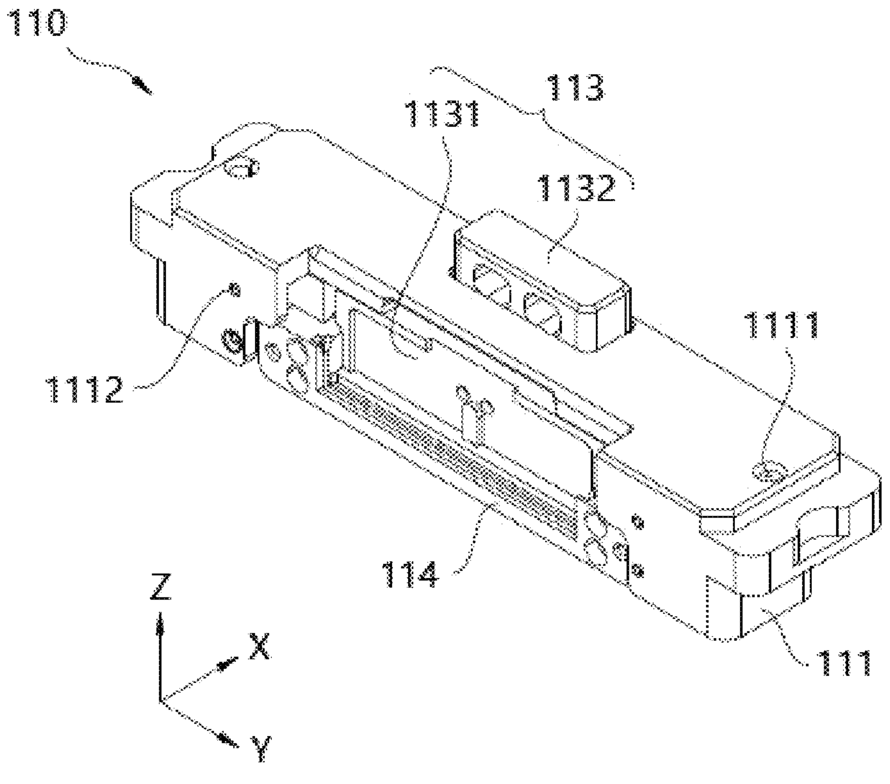
FIG. 5 is a perspective view of an insert according to an embodiment of the disclosure.
Figure 6:
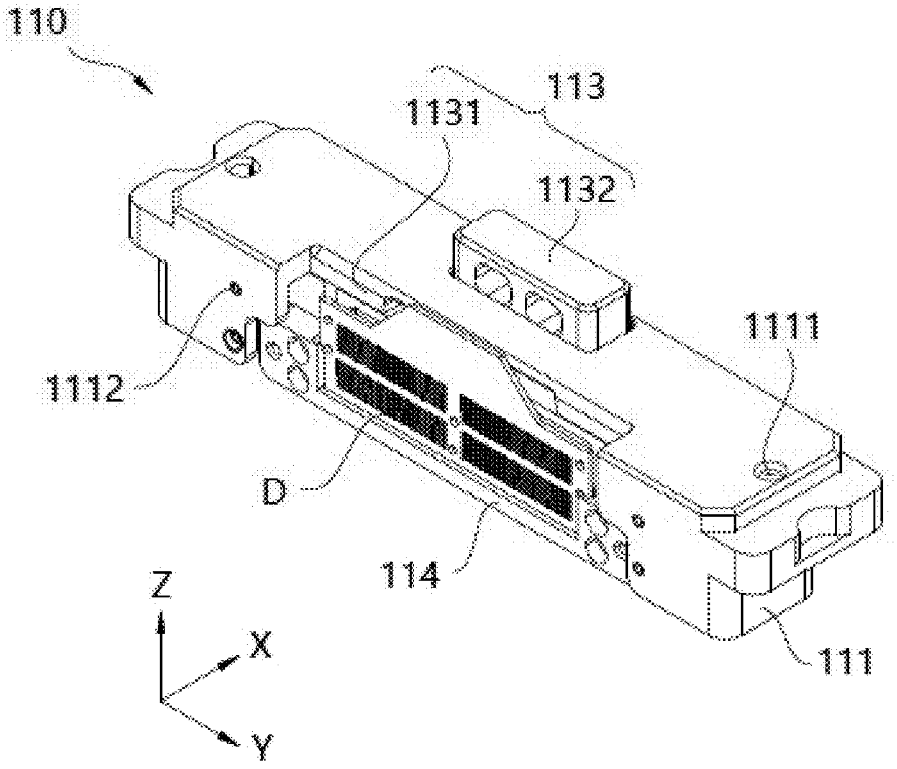
FIG. 6 is a perspective view showing that a semiconductor device is mounted to an insert according to an embodiment of the disclosure.

As shown in FIGS. 5 to 6, the insert 110 may include a mounting block 111 and a push unit 113.

The mounting block 111 may allow a semiconductor device D to be mounted thereto having an angle to the X-Y plane (i.e., the plane formed by the first axis and the second axis). For example, the semiconductor device D may be perpendicular to the X-Y plane while being mounted to the mounting block 111. Further, the lateral surface of the semiconductor device D may be exposed to the outside of the insert 110 while being mounted to the mounting block 111, and face in a direction intersecting a direction where an external force acts on the insert 110 for a push operation.

Based on FIGS. 5 to 6, the mounting block 111 may include the mounting frame 114 in a front lower direction. The mounting frame 114 may be formed to advance and retreat along the X-axis with respect to another portion (hereinafter referred to as a mounting block body) of the mounting block 111.

The mounting frame 114 may include a groove formed as recessed on an upper end portion thereof, to which a lower end portion of the semiconductor device D is mounted. In the state that the semiconductor device D is mounted to the groove, the terminals located on the lateral surface of the semiconductor device D may be exposed to the front.

The push unit 113 may be configured to move the semiconductor device D forward. The direction in which the push unit 113 moves the semiconductor device D will be referred to as a pushing direction, and the pushing direction based on FIGS. 5 to 6 may refer to a direction in which the value of the X-axis decreases.

In more detail, the push unit 113 may move the semiconductor device D and/or the mounting frame 114 forward in the pushing direction with respect to the mounting block body. The push unit 113 may include an advance and retreat member 1131, and a pressing-direction switching unit 1132.

The advance and retreat member 1131 may form a part of the front surface of the mounting block body. The advance and retreat member 1131 may support the lateral surface of the semiconductor device D facing the mounting block body. Further, the front surface of the advance and retreat member 1131 may be shaped not to be covered up with the lateral surface of the semiconductor device D.

The advance and retreat member 1131 is formed to advance and retreat with respect to the mounting block body, and advances to push the semiconductor device D and/or the mounting frame 114 forward. In this case, the front-end portion of the mounting block body may be provided to advance and retreat along with the advance and retreat of the advance and retreat member 1131 separately from the other portions.

Figure 8:
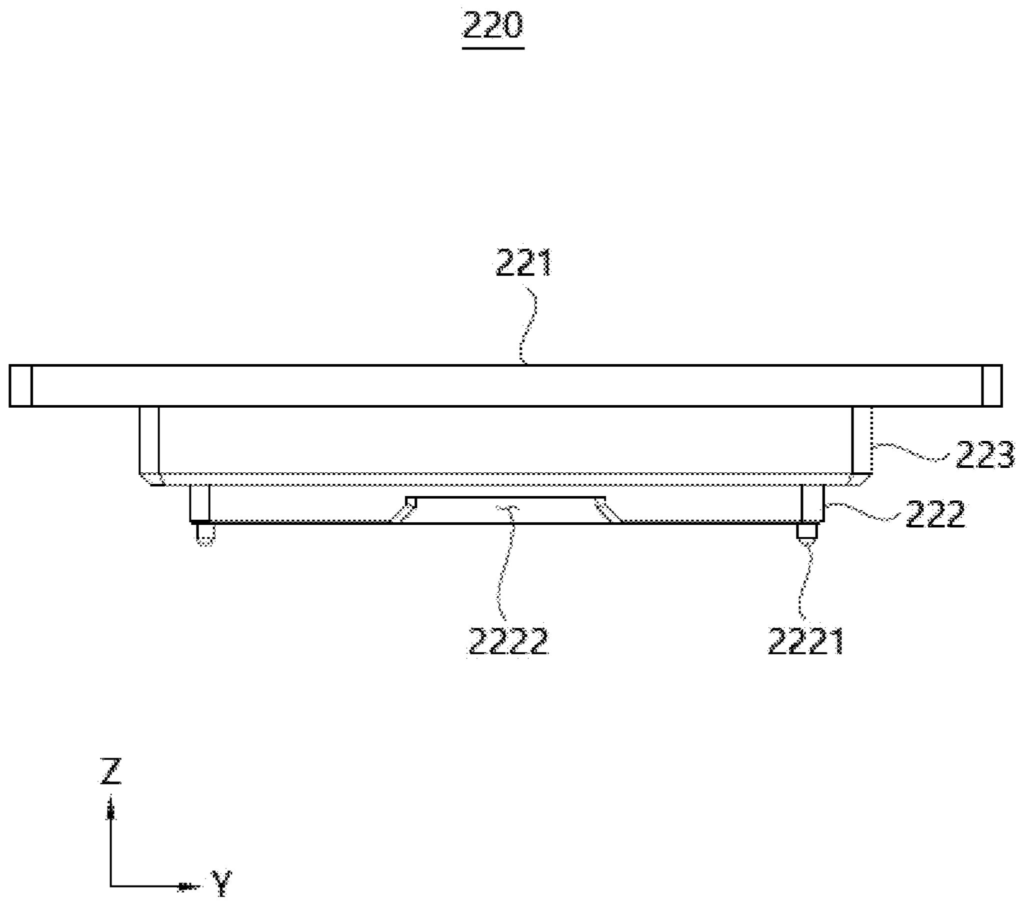
FIG. 8 is a view showing a portion of a pressing unit according to an embodiment of the disclosure, viewed from the front.

The pressing-direction switching unit 1132 may move between a standby position and a pressing position by a pressing unit 220 (see FIG. 8). The axis of connecting the standby position and the pressing position may intersect the pushing direction. In more detail, the axis of connecting the standby position and the pressing position may be perpendicular to the pushing direction. For example, the axis of connecting the standby position and the pressing position may be parallel to the Z-axis.

The pressing-direction switching unit 1132 may switch a vertical external force of the pressing unit 220 over to a horizontal force, thereby moving the advance and retreat member 1131 in the pushing direction. By the pressing-direction switching unit 113, the pressing direction of the pressing unit 220 and the pushing direction of the advance and retreat member 1131 may intersect each other.

On the top surface of the mounting block 111, guide holes 1111 may be formed at opposite end portions along the Y-axis. The guide holes 1111 may be formed penetrating the mounting block 111 along the Z-axis so as to be parallel to the pressing direction of the pressing unit 220.

In the mounting block 111, insert alignment holes 1112 formed penetrating the mounting block 111 in parallel to the pushing direction may be located at positions adjacent to the mounting frame 114. The insert alignment holes 1112 may be formed so that the insert 110 can move along the pushing direction and be aligned with the insert guide block 211 (see FIG. 7).

Although not shown, preparation alignment holes (not shown) may be formed penetrating the bottom surface of the mounting block 111 so that the insert 110 can be aligned with the insert guide block 211 while being seated on the preparation surface. The preparation alignment holes may be formed penetrating the bottom surface of the mounting block 111 in a direction parallel to the direction in which the test tray 100 approaches the preparation surface. For example, the preparation alignment holes may extend in a direction parallel to the Z-axis.

The insert 110 may move inside the insert mounting groove 121 and be adjusted in position, while being aligned by the guide holes 1111, the insert alignment holes 1112 and/or the preparation alignment holes.

Further, although not shown, a push alignment hole (not shown) may be formed penetrating the advance and retreat member 1131 and extended along the pushing direction. The push alignment hole may have a smaller diameter than the insert alignment hole 1112.

The push alignment hole may refer to an element for aligning the semiconductor device D and/or the advance and retreat member 1131 with the socket additionally after the insert 110 is aligned by the insert alignment holes 1112.

The push alignment hole may be formed in a portion, which is not covered with the semiconductor device D, on the advance and retreat member 1131. Alternatively, if the semiconductor device D has a penetrated portion, the push alignment hole may be formed at a position, which is exposed through the penetrated portion of the semiconductor device D, on the advance and retreat member 1131.

Meanwhile, the advance and retreat member 1131 may be movably mounted to the front surface of the mounting block 111 so as to be adjusted in position through the push alignment hole. Alternatively, the semiconductor device D may be slightly movable in the Z-axial and Y-axial directions while mounted to the mounting frame 114, and thus moved to be aligned by a member interacting with the push alignment hole.

In the foregoing example, the guide holes 1111, the insert alignment holes 1112, the push alignment holes, and the preparation alignment holes are formed in the insert 110. However, the disclosure is not necessarily limited to this example.

For example, the insert 110 may include guide pins (to be described later) instead of the guide holes 1111. In this case, the apparatus may include the guide holes 1111 instead of the guide pins to interact with the insert 110.

Further, the insert 110 may include insert alignment pins (to be described later) instead of the insert alignment holes 1112. In this case, the apparatus may include the insert alignment holes 1112 instead of the insert alignment pins to interact with the insert 110.

Further, the insert 110 may include push alignment pins (to be described later) instead of the push alignment holes. In this case, the apparatus may include the push alignment holes instead of the push alignment pins to interact with the insert 110.

Further, the insert 110 may include preparation alignment pins (to be described later) instead of the preparation alignment holes. In this case, the apparatus may include the preparation alignment holes instead of the preparation alignment pins to interact with the insert 110.

Figure 7:
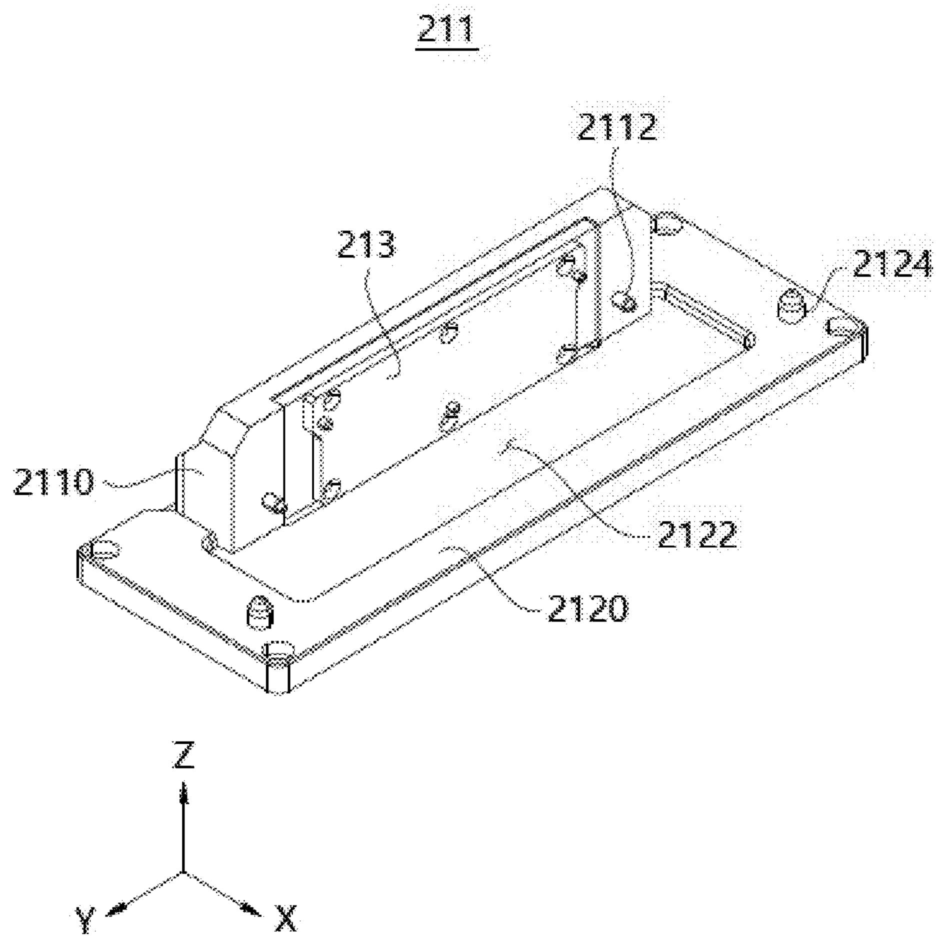
FIG. 7 is a perspective view of an insert guide block according to an embodiment of the disclosure.

Below, the insert guide block according to an embodiment of the disclosure will be described with reference to FIG. 7. FIG. 7 illustrates an insert guide block according to an embodiment of the disclosure.

On the rear surface of the insert guide block 211, a socket 213 may be located. The socket 213 may have the same or similar shape to the lateral surface of the semiconductor device D so as to come into contact with the lateral surface of the semiconductor device D. Further, the socket 213 may include various terminals to be electrically connected to the terminals on the lateral surface of the semiconductor device D. For example, the socket 213 may include pogo pins. For example, the socket 213 may be a flat member with the pogo pins to which the terminals of the semiconductor device D are connected.

Hereinafter, the surface of the socket 213, with which the lateral surface of the semiconductor device D comes into close contact, will be referred to as a connection surface. The connection surface may be located at a position where the axis intersecting the pressing direction of the pressing unit 220 (see FIG. 8) passes. For example, the connection surface may be a surface perpendicular to the pushing direction. In the socket 213, members to be electrically connected to the terminals may be located at positions corresponding to the terminals of the semiconductor device D on the connection surface.

To prevent the socket 213 from being damaged by the external force caused by the push unit 113, the insert guide block 211 may include a stiffner 2110. The stiffner 2110 may be provided as a block that is located in front of the socket 213 and supports the front surface of the socket 213.

The stiffner 2110 may serve as a reinforcing material added to supplement the strength and the stiffness of the socket 213. Even though the external force caused by the push unit 113 acts on the rear surface of the socket 213, the stiffner 2110 supports the socket 213 not to bend more than a certain degree.

A support base 2120 may provide a support surface on which the insert 110 is seated. When the socket 213 and the stiffner 2110 support the front of the semiconductor device D, the support base 2120 may support the bottom of the mounting block 111.

On the top surface of the support base 21201, a seat groove 2122 in which the mounting frame 114 is seated may be formed behind the socket 213. The width of the seat groove 2122 in the Y-axial direction may correspond to the width of the mounting frame 114 in the Y-axial direction.

The length of the seat groove 2122 in the X-axial direction may be set considering both the maximally retreated state and the maximally advanced state of the mounting frame 114. When the test tray 100 is seated on the test board 210, the mounting frame 114 may be initially located on the rear end side of the seat groove 2122. Then, when the mounting frame 114 advances to the maximum extent in the pushing direction, the mounting frame 114 may be located on the front-end side of the seat groove 2122.

The inner wall of the seat groove 2122, which defines the depth of the seat groove 2122, may support both sides of the mounting frame 114 that advances and retreats. Therefore, the mounting frame 114 may have minimal shaking while advancing and retreating.

Insert alignment pins 2112 refer to pins protruding from the stiffner 2110 rearward to interact with the insert alignment holes 1112. The insert alignment pins 2112 may protrude behind the stiffner 2110 along the axis parallel to the pushing direction. The diameter and protruding length of the insert alignment pin 2112 may correspond to the diameter and depth of the insert alignment hole 1112.

The insert alignment pins 2112 are inserted in the insert alignment holes 1112 formed in the front-end portion of the mounting block 111 that advances based on the operation of the push unit 113, and guides the advance of the mounting block 111. In more detail, the insert alignment holes 1112 are formed in the front-end portion of the mounting block body that advances and retreats along with the advance and retreat member 1131, and allows the insert alignment pins 2112 to be inserted therein while moving forward.

Although not shown, the socket 213 and/or the stiffner 2110 may include the push alignment pins (not shown) to additionally align the semiconductor device D after the insert 110 is aligned by the insert alignment pins 2112. The push alignment pins may protrude from the socket 213 and/or the stiffner 2110 rearward along the axis parallel to the pushing direction.

The diameter and protruding length of the push alignment pins may correspond to the diameter and depth of the push alignment hole. In more detail, the push alignment pin is shorter than the insert alignment pin 2112, and protrudes rearward less than the insert alignment pin 2112 based on the connection surface. Further, the push alignment pin may have a smaller diameter than the insert alignment pin 2112.

Therefore, the insert 110 is primarily aligned by the insert alignment pins 2112 and the insert alignment holes 1112 while advancing, and secondarily the position of the semiconductor device D based on the connection surface is precisely adjusted by the push alignment pins and the push alignment holes.

On the support base 2120, preparation alignment pins 2124 may be disposed protruding upward along the Z-axis with the seat groove 2122 therebetween. The preparation alignment pins 2124 may be inserted in the preparation alignment holes of the insert 110 seated in the insert guide block 211, thereby aligning the position of the insert 110. By the operations of the preparation alignment pins 2124 and the preparation alignment holes, the insert 110 is seated at an appropriate position on the insert guide block 211.

Below, the pressing unit 220 according to an embodiment of the disclosure will be described with reference to FIG. 8. FIG. 8 is a view showing a portion of a pressing unit according to an embodiment of the disclosure, viewed from the front.

The pressing unit 220 may press the insert 110 toward the socket 213. As shown in FIG. 8, the pressing unit 220 according to an embodiment of the disclosure may include a pressing plate 221, a primary push body 222, and a secondary push body 223.

The pressing plate 221 may refer to a plate provided to move up and down along the Z-axis by an external driving unit. The external driving unit may be variously implemented by an actuator and a motor. For example, the pressing plate 221 may have the same or similar length and width to the test tray 100.

The pressing plate 221 may be disposed to face the preparation surface of the test board 210. For example, the pressing plate 221 may be installed to face the test board 210 in a chamber where the test board 210 is placed.

The plurality of primary push bodies 222 and the plurality of secondary push bodies 223 may be provided on the bottom surface of the pressing plate 221. On the pressing plate 221, each primary push body 222 and each secondary push body 223 may be installed at corresponding positions of each insert 110 on the test tray 100.

The primary push body 222 may be formed to be retractable into the secondary push body 223. The primary push body 222 may come into primary contact with the insert 110, and align the insert 110 with the pressing unit 220.

For this alignment, the primary push body 222 may include guide pins 2221 extending downward along the Z-axis from opposite end portions thereof. The guide pins 2221 may be inserted into the guide holes 1111 (see FIGS. 5 to 6) as the pressing plate 221 moves down. To this end, the diameter and length of the guide pin 2221 may be formed to correspond to the diameter and depth of the guide hole 1111. The position of the insert 110 may be aligned on the insert mounting groove 121 as the guide pins 2221 are inserted into the guide holes 1111.

The secondary push body 223 may be located between the pressing plate 221 and the primary push body 222, and press the insert 110 after the primary push body 222 comes into contact with the insert 110.

After coming into contact with the insert 110, the primary push body 222 may retract into the secondary push body 223 as the pressing plate 221 continues to move down. The secondary push body 223 may press the insert 110 downward after the primary push body 222 retracts thereinto to the maximum extent.

Meanwhile, the primary push body 222 includes a contact preventing recess 2222 formed in a front center portion thereof, and a movable member passing groove 2223 (see FIGS. 11 and 12) formed in a rear center portion thereof. In this regard, description will be made with reference to FIGS. 11 and 12.

Figure 9:
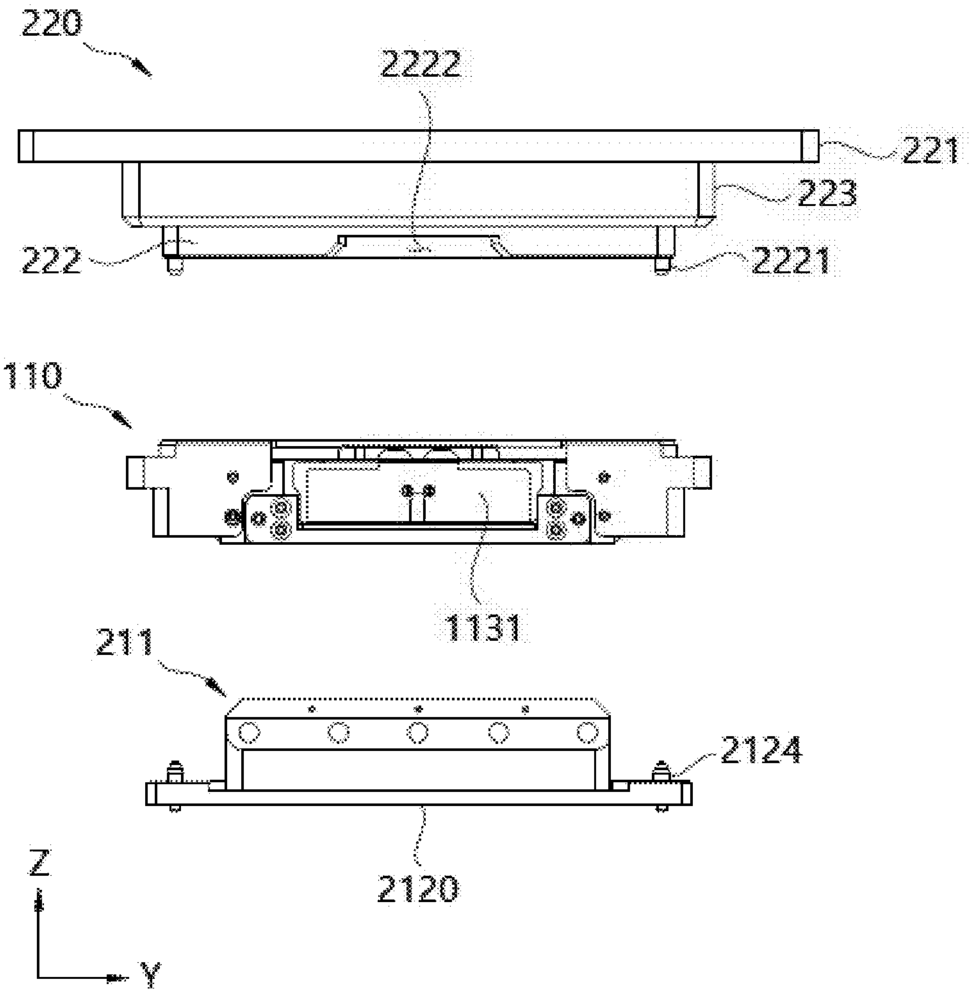
FIG. 9 is a view showing that a pressing unit, an insert, and an insert guide block are arranged in the Z-axis according to an embodiment of the disclosure.
Figure 10:
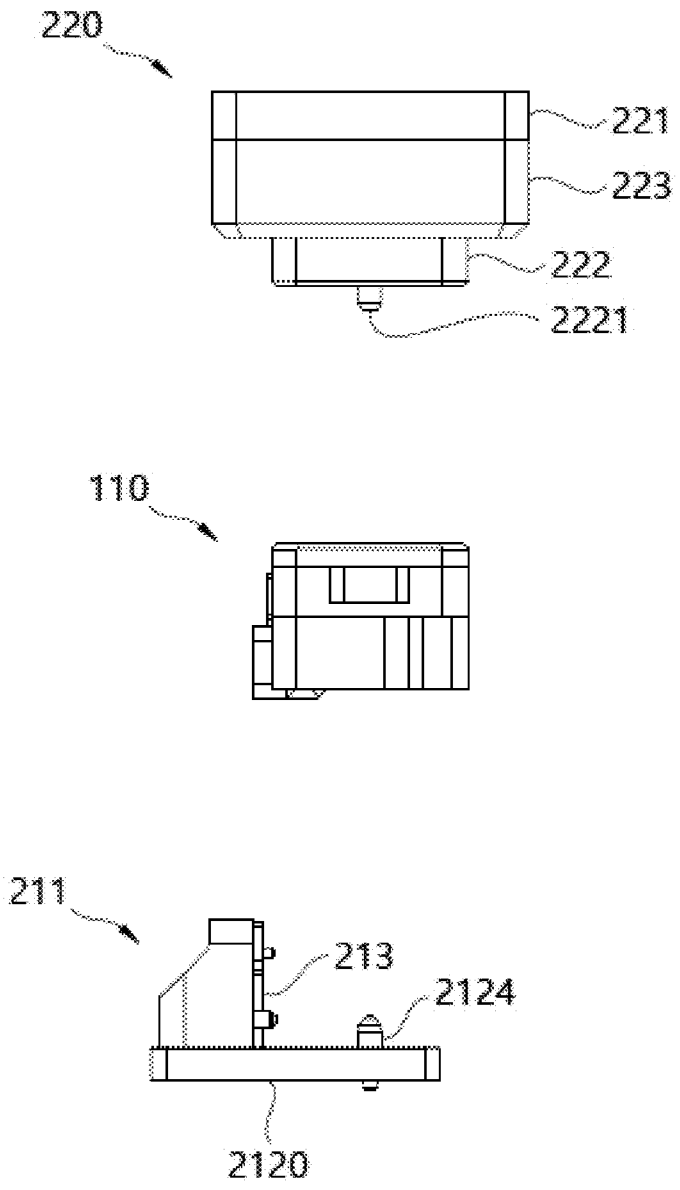
FIG. 10 is a view showing that the pressing unit, the insert, and the insert guide block are arranged in the Z-axis according to an embodiment of the disclosure, viewed at an angle different from that of FIG. 9.

Below, it will be described with reference to FIGS. 9 and 10 that the pressing unit, the insert and the insert guide block are aligned according to an embodiment of the disclosure. FIG. 9 is a view showing that a pressing unit, an insert, and an insert guide block are arranged in the Z-axis according to an embodiment of the disclosure. FIG. 10 is a view showing that the pressing unit, the insert, and the insert guide block are arranged in the Z-axis according to an embodiment of the disclosure, viewed at an angle different from that of FIG. 9.

As shown in FIGS. 9 and 10, the insert 110 of the test tray 100 moved into the test apparatus 200 may be located between the primary push body 222 and the insert guide block 211.

The insert 110 is primarily adjusted in position by the preparation alignment pins 2124 while being first seated on the insert guide block 211, and then secondarily adjusted in position by the guide pins 2221 as the primary push body 222 moves down.

In more detail, the guide pin 2221 may have a smaller diameter than the preparation alignment pin 2124. Therefore, the insert 110 may be roughly adjusted in position while being seated on the preparation alignment pins 2124, and then additionally precisely adjusted in position by the guide pins 2221.

In this case, there may be some of the inserts 110 included in the test tray 100, which are located being put on the preparation alignment pins 2124 without allowing the preparation alignment pins 2124 to be completely inserted therein. Such inserts 110 are then moved down by the force of the primary push body 222 pressing the mounting block 111, so that the preparation alignment pins 2124 can be completely inserted into the preparation alignment holes.

Figure 11:
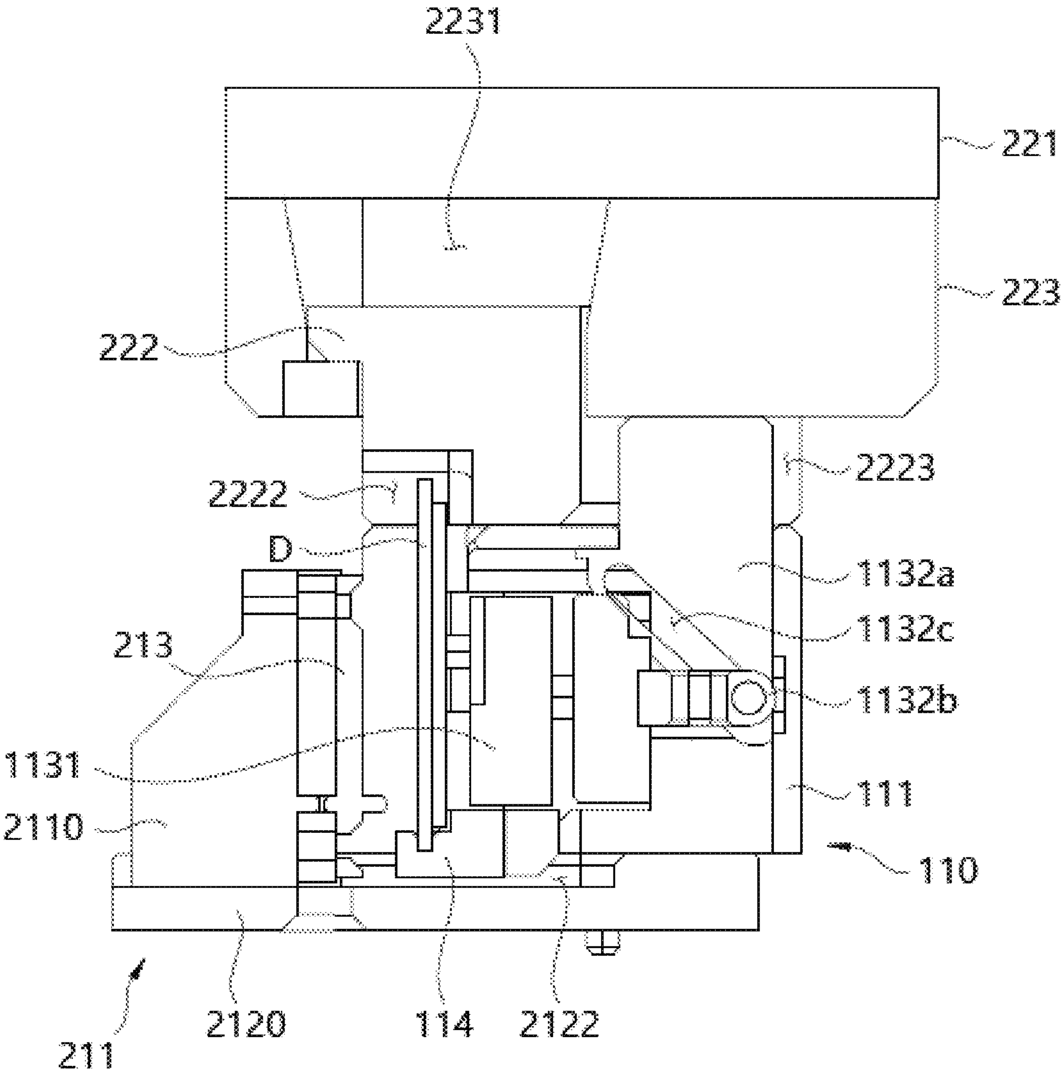
FIG. 11 is a view showing that a primary push body is in contact with a mounting block according to an embodiment of the disclosure.

Below, a pressing direction switching operation of a push unit according to an embodiment of the disclosure will be described in detail with reference to FIGS. 11 and 12. FIG. 11 is a view showing that a primary push body is in contact with a mounting block according to an embodiment of the disclosure. In this connection, FIG. 12 is a view showing that a secondary push body presses a movable member according to an embodiment of the disclosure.

Figure 12:
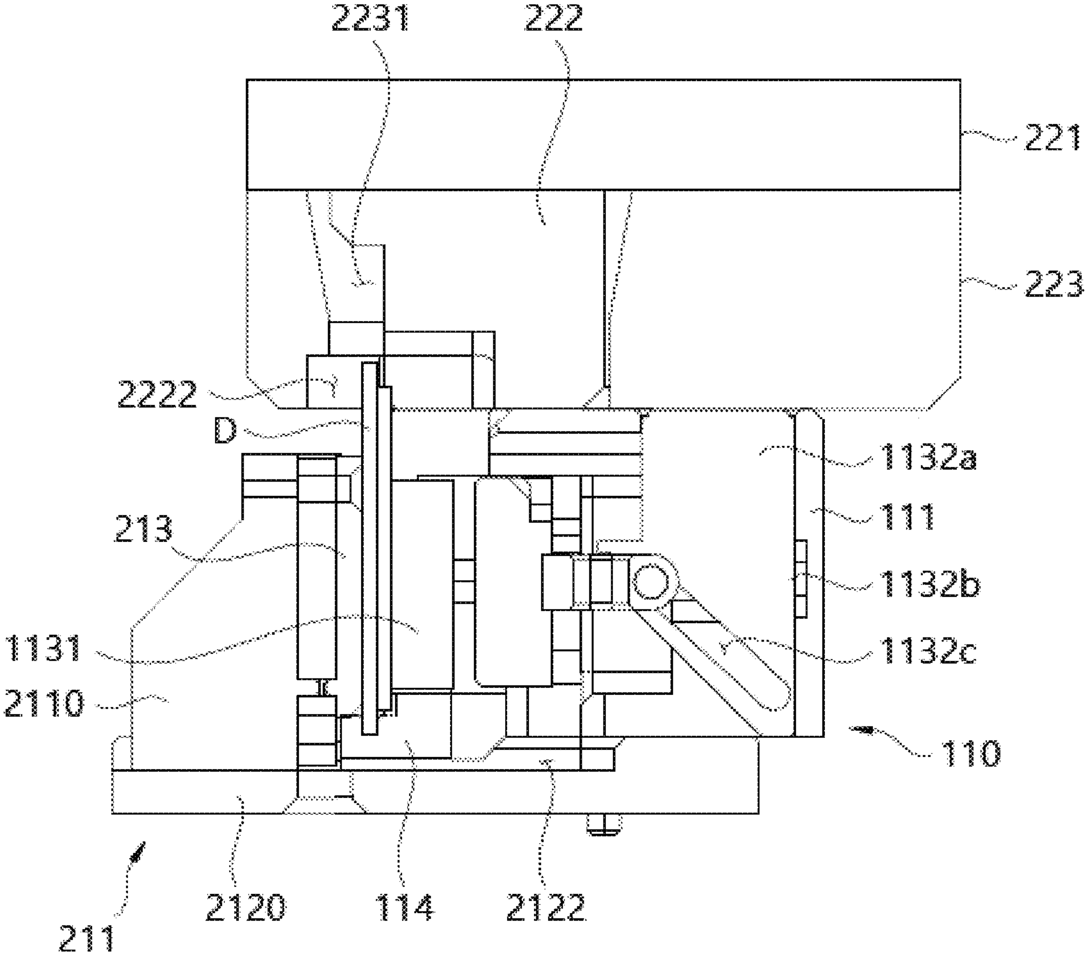
FIG. 12 is a view showing that a secondary push body presses a movable member according to an embodiment of the disclosure.

A first push body 222 protrudes from a second push body 223 to the maximum extent in the state of FIG. 11, and retracts into the second push body 223 to the maximum extent in the state of FIG. 12.

The second push body 223 may include an accommodating space 2231 formed to accommodate the first push body 222 of the retracted state. Although not shown, an elastic member may be placed inside the accommodating space 2231 so as to keep the first push body 222 protruding under the condition that no external force is applied thereto. For example, the elastic member may include a coil spring.

The first push body 222 is pressed by the pressing plate 221 after coming into contact with the mounting block 111, and retracts into the accommodating space 2231 while overcoming the elastic force of the elastic member.

The first push body 222 may be formed to be in contact with the entire top surface of the mounting block 111, but not in contact with the semiconductor device D and the movable member 1132*a*.

To this end, the contact preventing recess 2222 may be formed in the front of the first push body 222 so that the first push body 222 being in contact with the mounting block 111 can be prevented from being in contact with the first push body 222 and the semiconductor device D.

The contact preventing recess 2222 may be formed by recessing the surface of the first push body 222 so as to prevent the semiconductor device D and the first push body 222 from being in contact with each other in both the protruding state and the retracted state of the first push body 222.

The movable member passing groove 2223 may be formed in the back of the first push body 222 so as to prevent a movable member 1132*a* and the first push body 222 from being in contact with each other. Therefore, the movable member 1132*a* may be prevented from being pressed by the first push body 222 even when located in the standby position.

As described above, when the preparation alignment pins 2124 are not completely inserted in the insert 110, the insert 110 may first be completely seated by the first push body 222. In this process, the movable member 1132*a* may be located inside the movable member passing groove 2223 before the insert 110 is completely seated and then comes into contact with the second push body 223.

Therefore, according to an embodiment of the disclosure, the semiconductor device D is prevented from moving forward as the movable member 1132*a* is pressed in the state that the insert 110 is not completely seated on the support base 2120.

Below, the pressing-direction switching unit 1132 will be described in detail with reference to FIGS. 11 to 12. The pressing-direction switching unit 1132 may further include the movable member 1132*a*, a slider 1132*b*, and an elastic member (not shown).

The movable member 1132*a* may move up and down between the standby position of FIG. 11 and the pressing position of FIG. 12. The upper end portion of the movable member 1132*a* may be exposed to the outside of the mounting block 111 in the standby position. The exposed portion of the movable member 1132*a* may be pressed by the second push body 223 and move toward the inside of the mounting block 111 as shown in FIG. 12. While the movable member 1132*a* is pressed by the second push body 223, the first push body 222 may retract into the second push body 222.

The mounting block 111 may include a through hole formed in a direction parallel to the Z-axis so that the movable member 1132*a* can move between the standby position and the pressing position. The depth of the through hole may be equal to or larger than the height of the movable member 1132*a* so that the movable member 1132*a* can be completely accommodated in the through hole.

The movable member 1132*a* may include a guide slit 1132*c* formed along the axis positioned between the axis where the movable member 1132*a* is moved and the axis where the advance and retreat member 1131 advances and retreats. In this case, the axis (hereinafter referred to as a slit axis) positioned between the axis where the movable member 1132*a* is moved and the axis where the advance and retreat member 1131 advances and retreats may mean an axis as follows.

The slit axis may refer to an axis that has an angle smaller than the angle between the axis where the movable member 1132*a* is moved (i.e., the axis parallel to the pressing direction) and the bottom surface of the support base 2120 and/or the mounting block 111, and larger than the angle between the axis where the advance and retreat member 1131 advances and retreats (i.e., the angle parallel to the pushing direction) and the bottom surface of the support base 2120 and/or the mounting block 111.

For example, the axis parallel to the pressing direction may be perpendicular to the support base 1120 or the bottom surface of the mounting block 111. Further, the axis parallel to the pushing direction may have an angle of 0 degrees to the support base 2120 or the bottom surface of the mounting block 111. In this case, the slit axis may have an angle of about 45 degrees to the support base 2120 or the bottom surface of the mounting block 111.

The slider 1132*b* is slidably coupled to the movable member 1132*a*, and switches the direction of the pressing force over to the pushing direction, thereby transferring the pressing force of the pressing unit 220 to the advance and retreat member 1131. In more detail, the slider 1132*b* may have a one end connected to the rear-end portion of the advance and retreat member 1131, and the other end sliding along the slit axis on the guide slit 1132*c*.

When the guide slit 1132*c* moves up and down as the movable member 1132*a* moves up and down, the slider 1132*b* may advance or retreat using force received by the inner wall of the movable member 1132*a* forming the guide slit 1132*c*. In other words, position change of the other end of the slider 1132*b* within the guide slit 1132*c* due to the upward and downward movement of the movable member 1132*a* may cause the slider 1132*b* to advance or retreat.

When the movable member 1132*a* is in the pressing position, the slider 1132*b* may be located at the top of the guide slit 1132*c*. Further, in this state, the slider 1132*b* may advance maximally with respect to the mounting block 111.

On the other hand, when the movable member 1132*a* is in the standby position, the slider 1132*b* may be located at the bottom of the guide slit 1132*c*. In this state, the slider 1132*b* may retreat maximally toward the inside of the mounting block 111.

Due to the position change of the slider 1132*b* within the guide slit 1132*c*, the rear-end portion of the advance and retreat member 1131 connected to the slider 1132*b* may move together with the slider 1132*b*.

The front-end portion of the advance and retreat member 1131 may come into contact with the semiconductor device D and/or the mounting frame 114 while advancing. The advance and retreat member 1131 may continue to move even after coming into contact with the semiconductor device D and/or the mounting frame 114, thereby moving the semiconductor device D toward the socket 213.

Although not shown, the pressing-direction switching unit 1132 may include an elastic member that provides a restoring force to maintain the movable member 1132*a* in the standby position under the condition that no external force is applied thereto. The elastic member may be placed inside the through hole of the mounting block 111, thereby elastically supporting the movable member 1132*a* upwards. For example, such an elastic member may be provided as a coil spring.

According to an embodiment of the disclosure, when the movable member 1132*a* is released from the press by moving the pressing plate 221 upward, the movable member 1132*a* is restored to the standby position by the elastic member, and thus the advance and retreat member 1131 is restored to the initial position, thereby separating the semiconductor device D from the socket 213.

Figure 13:
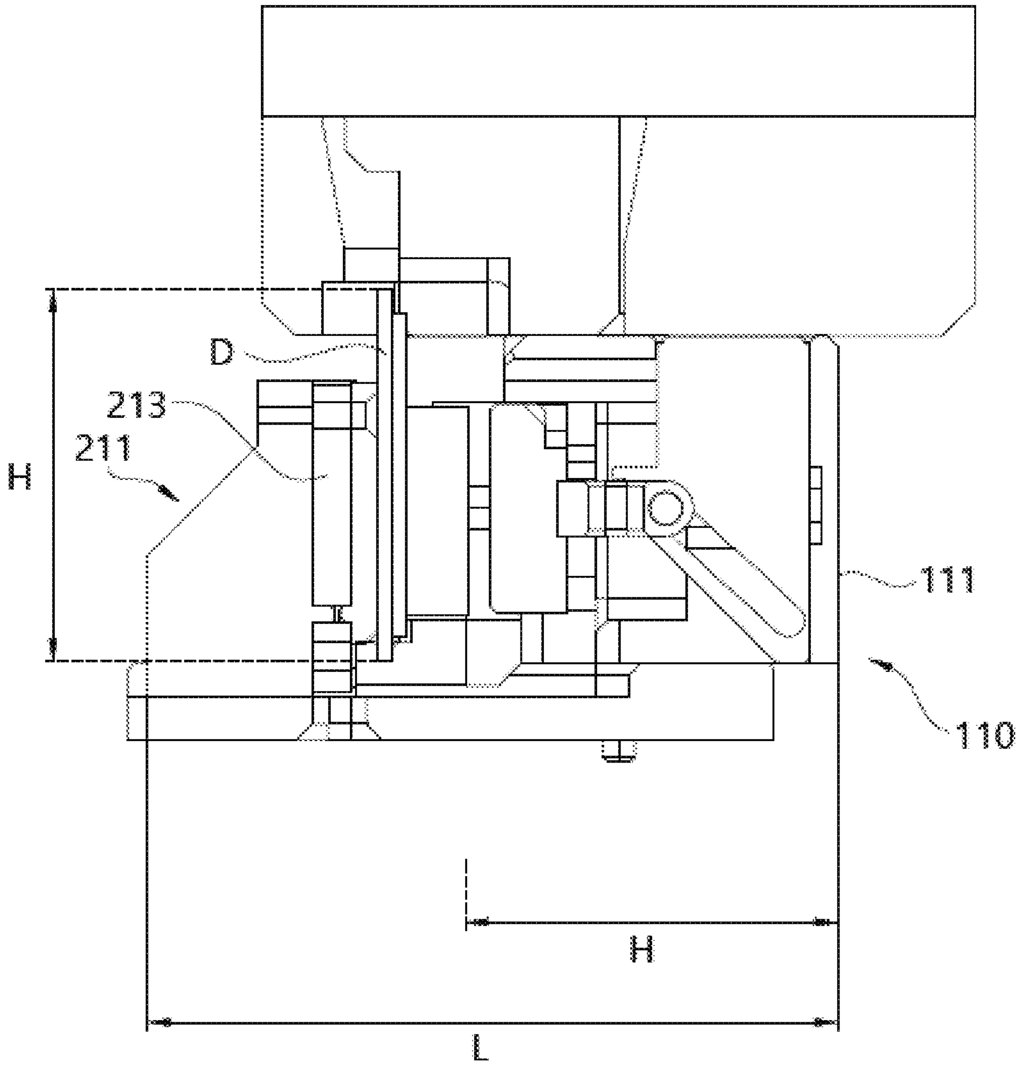
FIG. 13 is a view showing comparison between the height of a lateral surface of a semiconductor device and a length of when an insert is in close contact with a socket according to an embodiment of the disclosure.

Below, the length of when the insert and the socket are in close contact with each other will be described according to an embodiment of the disclosure with reference to FIG. 13. FIG. 13 is a view showing comparison between the height of a lateral surface of a semiconductor device and a length of when an insert is in close contact with a socket according to an embodiment of the disclosure As shown in FIG. 13, when the insert 110 and the socket 213 are in close contact with each other, the length L of a portion where the axis perpendicular to the lateral surface of the semiconductor device D (or the connection surface) passes through the insert 110 and the insert guide block 211 may be shorter than the height H of the lateral surface of the semiconductor device D.

In other words, the sum of the thickness of the semiconductor device D, the thickness of the insert guide block 211, and the thickness of the mounting block 111 may be shorter than the height H of the lateral surface of the semiconductor device D.

Therefore, according to an embodiment of the disclosure, more semiconductor devices D may be mounted to the insert 110 than those of when placed lying down on the preparation surface.

In the foregoing description, during the alignment based on the holes and pins, the holes and the pins used for aligning objects before other holes and pins may be loosely coupled to have a little room when coupled to each other.

In other words, the hole and pin taking priority in aligning objects over other holes and pins may have a slight gap therebetween in the state that the pin is inserted in the hole. Such a gap may be given in consideration of the hole and pin taking the next priority in aligning the objects. Due to this gap, while the pin taking lower priority is being inserted into the hole to additionally align the objects, the pin taking higher priority, which has used in aligning the objects, may also move within the hole.

According to the embodiments of the disclosure, the effects are at least as follows.

By maximizing the number of semiconductor devices that can be loaded on one tray, time taken in testing many semiconductor devices is efficiently shortened.

The effects of the disclosure are not limited to those described above, and various other effects are included in the foregoing description.

A person having ordinary knowledge in the art to which the disclosure pertains can understood that the disclosure may be embodied in other specific forms without changing technical spirit or essential features. Accordingly, the embodiments described above are illustrative and not restrictive in all aspects. The scope of the disclosure is defined by the appended claims rather than the foregoing detailed description, and all changes or modifications derived from the meaning and scope of the appended claims and their equivalents are construed as falling within the scope of the disclosure.

*Reference Numerals

| | |
|---|---|
| D: semiconductor device | H: handler |
| T: transport | |
| 100: test tray | 110: insert |

-continued

| *Reference Numerals | |
|---|---|
| 111: mounting block | 1111: guide holes |
| 1112: insert alignment hole | 113: push unit |
| 1131: advance/retreat member | |
| 1132: pressing-direction switching unit | |
| 1132a: movable member | 1132b: slider |
| 1132c: guide slit | 114: mounting frame |
| 120: frame | |
| 121: insert mounting groove | |
| 200: test apparatus | 210: test board |
| 211: insert guide block | 2110: stiffner |
| 2112: insert alignment pin | 2120: support base |
| 2122: seat groove | |
| 2124: preparation alignment pins | |
| 213: socket | 220: pressing unit |
| 221: pressing plate | 222: primary push body |
| 2221: guide pins | |
| 2222: contact preventing recess | |
| 2223: movable member passing groove | |
| 223: secondary push body | |
| 2231: accommodating space | |

What is claimed is:

1. A test tray to which a semiconductor device with terminals located on a lateral surface thereof is mounted, the test tray comprising:

a plurality of inserts to which the semiconductor devices are mounted; and a frame which supports the inserts in arrangement respectively corresponding to sockets of a test apparatus and has a length in a first axis and a width in a second axis, the inserts comprising:

a mounting block to which the semiconductor device is mounted with the lateral surface having an angle to a plane formed by the first axis and the second axis; and a push unit which moves the semiconductor device in a pushing direction to be spaced apart from the mounting block.

2. The test tray of claim 1, wherein the push unit comprises:

an advance and retreat member formed to advance and retreat on the mounting block, and moving the semiconductor device in the pushing direction while advancing; and a pressing-direction switching unit movable between a standby position and a pressing position on the mounting block along an axis intersecting the pushing direction, and moving from the standby position to the pressing position by an external force to move the advance and retreat member in the pushing direction.

3. The test tray of claim 2, wherein the pressing-direction switching unit comprises:

a movable member moving between the standby position and the pressing position; and a slider connected to the movable member, and pushing the advance and retreat member based on a force of pressing the movable member.

4. The test tray of claim 3, wherein the movable member comprises a guide slit formed along an axis positioned between an axis where the movable member is moved and an axis where the advance and retreat member advances and retreats, and the slider comprises a one end connected to the advance and retreat member and the other end sliding on the guide slit.

5. The test tray of claim 3, wherein the pressing-direction switching unit further comprises an elastic member that provides a restoring force to maintain the movable member located in the standby position upon applying no external force thereto.

6. The test tray of claim 3, wherein the movable member comprises a one end exposed to the outside of the mounting block while being in the standby position, and moved to the pressing position as pressed toward the other end by an external force.

7. The test tray of claim 3, wherein the mounting block comprises a guide hole or pin extending in parallel with a moving direction of the movable member to interact with elements of an external pressing device while the pressing device presses the movable member.

8. The test tray of claim 1, wherein the mounting block comprises an insert alignment hole or pin extending in parallel with the pushing direction to interact with the test apparatus.

9. The test tray of claim 8, wherein the push unit comprises a push alignment hole or pin extending in parallel with the pushing direction to further align the push unit with the socket after the test apparatus and the mounting block are aligned by the insert alignment hole or pin.

10. The test tray of claim 1, wherein, in a state that the semiconductor device is mounted to the mounting block to locate the lateral surface thereof in front of a front surface of the mounting block, a length of the semiconductor device from the lateral surface to a rear end of the mounting block is shorter than a height of the lateral surface of the semiconductor device.

11. An insert, to which a semiconductor device with terminals located on a lateral surface thereof is mounted, and which receives an external force to push the semiconductor device, the insert comprising:

a mounting block to which the semiconductor device is mounted with the lateral surface facing in a pushing direction intersecting a direction where the external force is applied; and a push unit which receives the external force and moves the semiconductor device in the pushing direction to be spaced apart from the mounting block.

* * * * *